United States Patent [19]

Arya et al.

[11] Patent Number: 5,055,141

[45] Date of Patent: Oct. 8, 1991

[54] ENHANCEMENT OF SHORT-CIRCUIT CURRENT BY USE OF WIDE BANDGAP N-LAYERS IN P-I-N AMORPHOUS SILICON PHOTOVOLTAIC CELLS

[75] Inventors: Rajeewa R. Arya, Jamison; Anthony W. Catalano, Rushland, both of Pa.

[73] Assignee: Solarex Corporation, Rockville, Md.

[21] Appl. No.: 467,367

[22] Filed: Jan. 19, 1990

[51] Int. Cl.$^5$ .................. H01L 31/075; H01L 31/18
[52] U.S. Cl. ..................................... 136/258; 357/30; 437/4; 437/110; 148/DIG. 160
[58] Field of Search ............... 136/258 AM; 357/30 J, 357/30 K, 30 N; 437/4, 110; 148/DIG. 160

[56] References Cited

U.S. PATENT DOCUMENTS

| | | | |
|---|---|---|---|
| 4,064,521 | 12/1977 | Carlson | 357/2 |
| 4,385,200 | 5/1983 | Hamakawa et al. | 136/258 |
| 4,476,346 | 10/1984 | Tawada et al. | 136/249 |
| 4,500,744 | 2/1985 | Nozaki et al. | 136/258 |
| 4,701,572 | 10/1987 | Sato et al. | 136/258 AM |
| 4,718,947 | 1/1988 | Arya | 136/258 |
| 4,781,765 | 11/1988 | Watanabe et al. | 136/249 TJ |
| 4,946,514 | 8/1990 | Nakagawa et al. | 136/258 AM |

FOREIGN PATENT DOCUMENTS

| | | | |
|---|---|---|---|
| 0244299A1 | 11/1987 | European Pat. Off. | 136/258 |
| 2604563 | 4/1988 | France | 136/258 |
| 56-8883 | 1/1981 | Japan | 136/258 AM |
| 57-181176 | 11/1982 | Japan | 136/258 AM |
| 59-178777 | 10/1984 | Japan | 136/258 AM |

OTHER PUBLICATIONS

Effect of Superlattice Doped Layers on the Performance of a —Si:H P-I-N Solar Cells, Arya et al., pp. 517–524, Mat. Res. Soc. Symp. Proc. vol. 40. 1986 Materials Research Society.

Improvements in the Conversion Efficiency of A-Si Solar Cells, Tsuda et al., pp. 1295–1300, IEEE Photovoltaic Specialists Conf., 1985.

"Microcrystalline Si:H Film and Its Application to Solar Cells" by Uchida et al., Jap. Jnl. of App. Phy., vol. 21, No. 9, pp. L586–L588, Sep. 1982.

"Role of Interfaces on the Performance and Stability of Amorphous Silicon-Germanium Alloy P-I-N Solar Cells" by Arya et al., Applied Physics Letters, vol. 55, No. 18, pp. 1894–1896, Oct. 30, 1989.

"Review of Progress on a-Si Alloy Solar Cell Research" by Catalano et al., Solar Cells, vol. 27, Nos. 1–4, pp. 25–37, Dec. 1989.

"Multi-Junction a-SiC:H/a-Si:H Solar Cells" by Yoshida et al., Proc. 8th E.C. Photovolt. Solar Energy Conf., vol. I, pp. 893–897, May 1988.

Primary Examiner—Aaron Weisstuch
Attorney, Agent, or Firm—Finnegan, Henderon, Farabow, Garrett & Dunner

[57] ABSTRACT

A photovoltaic cell that includes a transparent substrate, a front conductive layer formed on the substrate, a p-type layer formed on the front conductive layer, an i-layer of amorphous silicon formed on the p-layer, a wide bandgap n-type layer formed on the i-layer and a back contact layer formed on the n-type structure. The wide bandgap n-type layer may be an n-type sandwich structure which includes first, second, and third n-layers successively formed on one another. The first n-layer is formed on the i-layer, the second n-layer is formed on the first n-layer, and the n-layer is formed on the second n-layer. The second n-layer has an optical bandgap wider than the optical bandgap of the first and second n-type layers.

13 Claims, 6 Drawing Sheets

ENHANCEMENT OF SHORT-CIRCUIT CURRENT BY USE OF WIDE BANDGAP N-LAYERS IN P-I-N AMORPHOUS SILICON PHOTOVOLTAIC CELLS

BACKGROUND OF THE INVENTION

1. Field of the Invention

The present invention relates to photovoltaic cells containing amorphous silicon. More particularly, the present invention relates to amorphous silicon photovoltaic cells wherein the n-layer has a wide optical bandgap.

2. Description of the Related Art

A conventional photovoltaic module includes a substrate upon which one or more photovoltaic cells are disposed. The photovoltaic cells include a front contact disposed on the substrate made of, for example, a metal oxide such as tin oxide, followed by a p-i-n junction and a back contact made of, for example, a metal such as aluminum. The p-i-n junction includes a layer of a semiconductor material doped with a p-type dopant to form a p-layer, an undoped layer of a semiconductor material that forms an intrinsic or i-layer, and a layer of a semiconductor material doped with an n-type dopant to form an n-layer. Light incident on the substrate passes through the substrate, the front contact, and the p-i-n junction. The light is reflected by the rear contact back into the p-i-n junction.

In an amorphous silicon alloy p-i-n photovoltaic cell, the intrinsic layer is the photovoltaically active layer. That is, the intrinsic layer is the layer in which light is absorbed to create useful carriers. The phrase "useful carriers" means carriers that are collected to produce the photo-generated current in the photovoltaic cell. The photo-generated current is generated between the front and rear contacts of the photovoltaic cell.

Some of the incident light is absorbed by the doped layers (the p-layer and the n-layers) but the carriers generated in these layers have an extremely short carrier lifetime and recombine before they can be collected. Hence, absorption in the doped layers does not contribute to the photo-generated current in the photovoltaic cell and a minimization of absorption in doped layers enhances the short-circuit current of p-i-n photovoltaic cells. Light absorbed by the p-layer is in the portion of the visible spectrum having a short wavelength. As used herein, "short wavelength" means light having a wavelength on the order 390–450 nm. Absorption loss in the p-layer is a function of the bandgap of the p-layer. Thus, by adjusting the bandgap of the p-layer, the absorption loss in the p-layer can be minimized, for example, by using wide bandgap a-SiC:H p-layers.

An i-layer that comprises a-Si:H having a thickness on the order of 6,000 Å, for example, has an optical bandgap of 1.7 eV and an absorption co-efficient which is such that not all the incident light is absorbed in one pass through the thickness of an i-layer. The term "absorption coefficient" means the number of photons absorbed by a given material per unit length of that material. Light in the visible spectrum having a long wavelength, which is not absorbed in the first pass, is reflected back into the cell by the rear metal contact. As used herein, light of a "long wavelength" means light having a wavelength greater than 600 nm. This is true because the absorption co-efficient is a function of wavelength and the absorption co-efficient is high for light of wavelengths up to approximately 500 nm. The absorption co-efficient drops off for light of wavelengths greater than 500 nm to the extent that little of the long wavelength light is absorbed as it passes through the photovoltaic cell.

Thus, the long-wavelength light makes two passes through the n-layer. Depending on the thickness of the n-layer, usually on the order of about 500 Å, and its absorption co-efficient, which is normally higher than that of the i-layer, the light absorbed in the two passes through the n-layer does not contribute to the overall short circuit current of the photovoltaic cell.

In a p-i-n photovoltaic cell structure, the n-type doped layer has two functions: (1) it forms a rectifying junction with the i-layer, and (2) it forms ohmic contact with the rear contact. Both these functions require that the n-layer be highly conducting, that is, the layer must have a low electrical resistivity and a small activation energy. An n-layer with these characteristics facilitates the formation of a good rectifying junction between the i-layer and the n-layer and minimizes the contact resistance between the n-layer and the rear contact.

The present invention is intended to provide an amorphous silicon photovoltaic cell having an n-layer with a wider "effective" optical bandgap than conventional n-layers without detracting from the n-layer's conductivity characteristics. The term "effective" optical bandgap means the bandgap of the composite structure that comprises the n-layer of the present invention.

The present invention is also intended to provide a photovoltaic cell that includes an amorphous silicon n-layer of increased optical bandgap to minimize absorption of radiation as it propagates through the n-layer for the first time and after being reflected back through the n-layer. It is a purpose of the present invention to provide an n-layer of increased optical bandgap without decreasing the conductivity of the n-layer.

The present invention is further intended to provide a photovoltaic cell that includes amorphous silicon with an enhanced short circuit current.

Additional advantages of the present invention will be set forth in part in the description that follows and in part will be obvious from that description or can be learned by practice of the invention. The advantages of the invention can be realized and obtained by the structure and method particularly pointed out in the appended claims.

SUMMARY OF THE INVENTION

To overcome the problems of the prior art photovoltaic cells and in accordance with the purposes of the present invention, as embodied and broadly described herein, the photovoltaic cell of this invention comprises a transparent substrate, a layer of transparent conductive oxide formed on said transparent substrate, a p-type layer formed on said oxide layer, an i-layer of amorphous silicon formed on said p-layer, an n-type layer formed on the i-layer and a back contact layer formed on the n-layer.

As used herein, the term "substrate" refers to a structural element upon which the p-i-n junction and the front and back contacts are formed. Thus, during the forming of the photovoltaic cell, the "substrate" is disposed "sub-" or below the layers to be formed on it to complete the photovoltaic cell. The term "superstrate" can be used in the alternative to "substrate" to designate the same structural element. The term "superstrate" is most often used, however, when the photovoltaic cell is in use to indicate that the "superstrate" is oriented "super-" or above the layers formed on it that complete the photovoltaic cell. When thus oriented, sunlight is incident first on the "superstrate" and then passes through the "superstrate" to the p-i-n junction to generate electrical current.

Broadly, the n-type layer of the present invention has a higher optical bandgap than the i-layer upon which it is disposed. Further, the n-type layer is formed to have a suitable conductivity for forming good conductive contacts with the adjacent i-layer and back contact layer. As a result, the absorption of radiation that propagates through the n-layer is reduced and the photovoltaic cell including the n-layer has an enhanced short circuit current. In one embodiment in a photovoltaic cell including a p-i-n junction having an i-layer formed of a-SiGe:H, the n-layer is preferably formed of a-Si:H.

In another embodiment of the present invention, the n-type layer is of amorphous silicon and is formed on the i-layer. The n-type layer includes a plurality of first and second n-type layers alternatingly formed on one another, one of the first n-type layers being formed on the i-layer. Each of the first n-type layers has a first optical bandgap, and each of the second n-type layers has a second optical bandgap wider than the first optical bandgap. Preferably, the first n-type layers include an even number of layers and the second n-type layers include an odd number of layers.

In another embodiment of the present invention, the n-layer is a superlattice n-layer of amorphous silicon formed on the i-layer. The superlattice n-layer includes a plurality of first and second layers alternatingly formed on one another. Each of the first layers has a first optical bandgap, and each of the second layers has a second optical bandgap wider than the first optical bandgap.

BRIEF DESCRIPTION OF THE DRAWINGS

The accompanying drawings, which are incorporated in and which constitute a part of specification, illustrate various embodiments of the invention and, together with the description, explain the principles of the invention.

DESCRIPTION OF THE PREFERRED EMBODIMENTS

Reference now will be made in detail to presently preferred embodiments of the invention, examples of which are illustrated in the accompanying drawings.

A photovoltaic cell in accordance with the present invention includes a transparent substrate, a front conductive layer formed on the substrate, a p-type layer formed on the front conductive layer, an i-layer of amorphous silicon formed on the p-type layer, an n-type layer formed on the i-type layer, and a back contact layer formed on the n-type layer.

Figure 1:
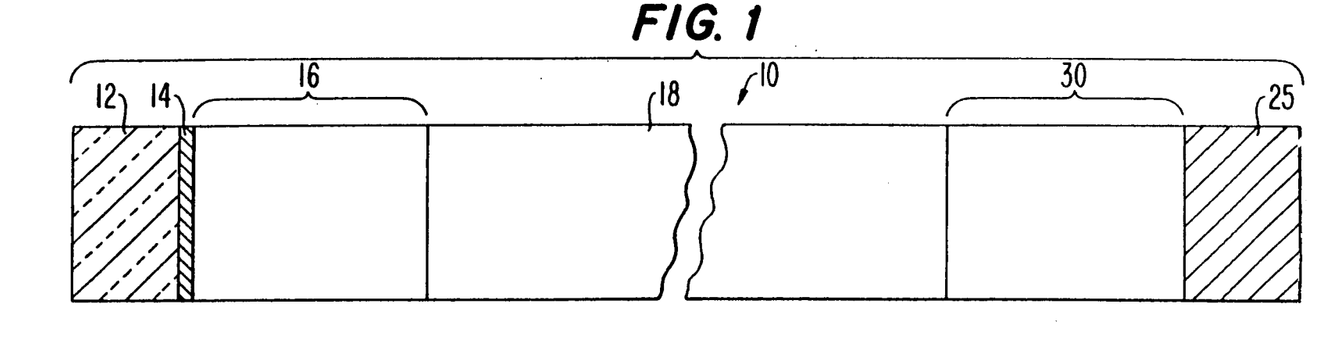
FIG. 1 is a schematic cross-sectional view of a photovoltaic cell having a wide bandgap n-type structure in accordance with the present invention.

As embodied herein, and shown in FIG. 1, a photovoltaic cell 10 includes a substrate 12 that preferably comprises a transparent material such as a conventional glass. A front conductive layer 14 is formed on the substrate. Front conductive layer 14 is preferably a transparent conductor such as a metal oxide and, preferably, the metal oxide comprising the conductive layer 14 is tin oxide. A p-layer 16 is then formed on front conductive layer 14. The p-layer 16 may be a conventional single layer of amorphous silicon doped with a p-type dopant. Alternatively, p-layer 16 may include multiple layers as in accordance with U.S. Pat. No. 4,718,947, which is specifically incorporated herein by reference. An i-layer 18 is formed on the p-type layer and is, preferably, amorphous silicon.

Figure 2:
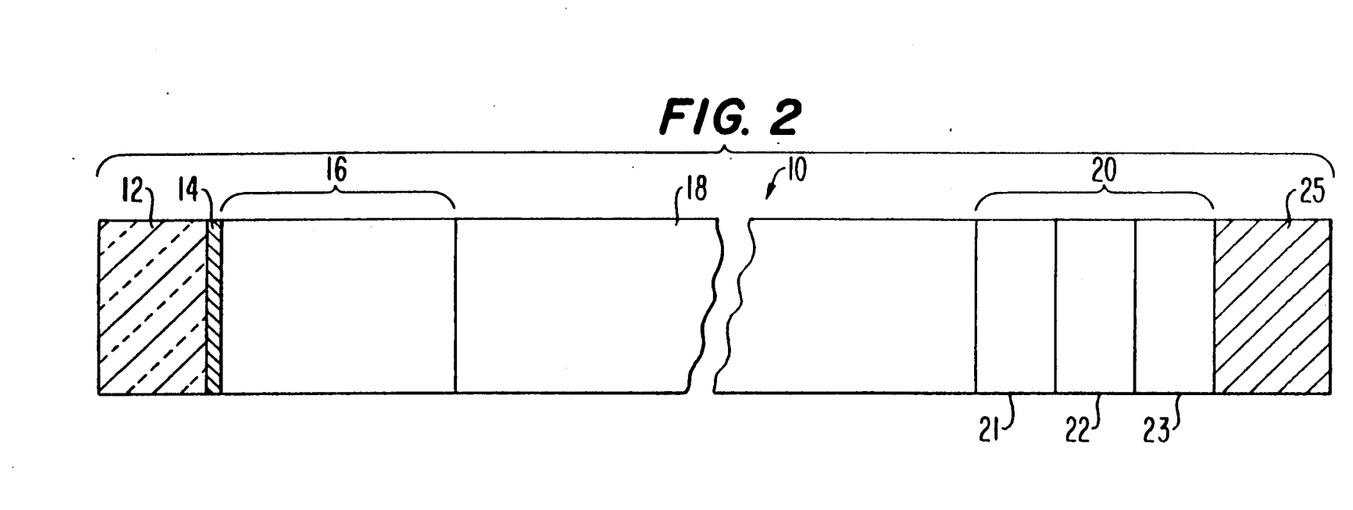
FIG. 2 is a schematic cross-sectional view of a photovoltaic cell having a sandwich n-type structure in accordance with the present invention.
Figure 6:
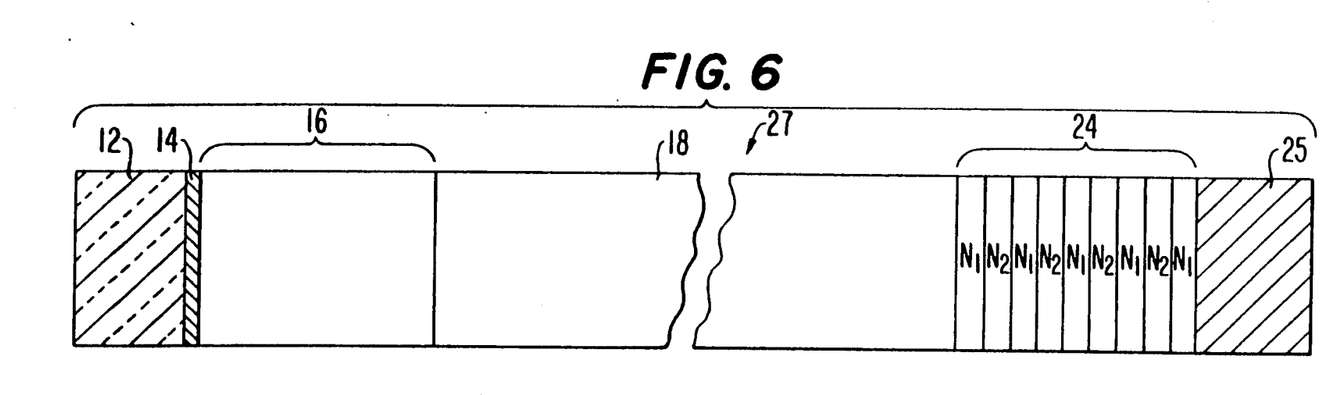
FIG. 6 is a schematic cross sectional view of a photovoltaic cell having a superlattice n-layer.

An n-type layer, in the form of a wide bandgap n-type layer 30 as shown in FIG. 1, a sandwich n-type structure 20 as shown in FIG. 2, or a superlattice layer 24 as shown in FIG. 6, all in accordance with the present invention, is then formed on i-layer 18. The wide bandgap n-type layer 30, the sandwich n-type structure 20 and the superlattice layer 24 are explained more fully below. A back contact layer 25 is formed on the n-type sandwich structure that is, preferably, a metal such as aluminum.

Except for the wide bandgap n-type layer 30, the sandwich n-type structure 20 or the superlattice layer 24, discussed below, the photovoltaic cell of the present invention has a conventional structure. In this regard, attention is drawn to U.S. Pat. No. 4,064,521, which is specifically incorporated herein by reference wherein the conventional structure of a photovoltaic cell is discussed. Also, see U.S. Pat. No. 4,718,947 and the discussion, infra, as it relates to the structure of a p-layer.

Before discussing the structure and function of wide bandgap n-type layer 30, sandwich n-type structure 20, and superlattice layer 24 in detail, it is important to consider the manner and effect of changing the bandgap of an n-layer in a p-i-n amorphous silicon photovoltaic cell. First, the advantages of increasing the bandgap of the n-layer can be understood by referring to FIG. 5 wherein the quantum efficiencies of two single p-i-n junction photovoltaic cells are compared. Both of these photovoltaic cells are identical with the exception of the composition of the n-layer. One photovoltaic cell has an a-SiGe:H n-layer having an optical bandgap ($E_g$) of 1.54 eV and a short-circuit current density of 18 mA/cm$^2$. The other photovoltaic cell has an a-Si:H n-layer having an optical bandgap of 1.7 eV and a short-circuit current density of 19 mA/cm$^2$, most of the difference being attributable to the increase in the long wavelength response of the photovoltaic cell having the wider bandgap a-Si:H n-layer.

It is also possible to alter the bandgap of the n-layer by alloying carbon with silicon by glow-discharge deposition of the n-layer from methane (a carbon containing gas), silane, and phosphine; the optical bandgap of the n-layer increases as the carbon content increases. Even though the bandgap increases with increasing carbon content, it becomes more and more difficult to dope the material and hence the resistivity of the n-layer increases with the increase in the optical bandgap.

Table I shows the change in the optical bandgap, the resistivity, and the activation energy of a-SiC:H n-layers as the methane concentration is changed in the gaseous mixture of silane, methane, and phosphine.

TABLE I

| Sample # | % $CH_4$ | $E_g$ (eV) | Resistivity (ohm-cm) | $E_a$ (eV) |
|---|---|---|---|---|
| 1 | 0 | 1.79 | $4.3 \times 10^2$ | 0.24 |
| 2 | 20 | 2.01 | $3.7 \times 10^4$ | 0.38 |
| 3 | 30 | 2.07 | $1.1 \times 10^6$ | 0.45 |
| 4 | 40 | 2.15 | $1.7 \times 10^6$ | 0.48 |

Due to the increase in the electrical resistivity of an a-SiC:H n-layer it does not provide good contact between the i-layer and the n-layer. Further, there is an increase in the series resistance through a photovoltaic cell including an a-SiC:H n-layer due to the poor n-layer to metal contact.

I. Wide Bandgap N-layers

FIG. 1 shows one embodiment of the present invention wherein a wide bandgap n-type layer 30 is formed on an i-type layer 18, the n-type layer 30 having a wider bandgap than the i-type layer 18. Preferably, the i-type layer 18 includes a-SiGe:H, having an optical bandgap of 1.55 eV, and n-type layer 30 includes a-Si:H, having an optical bandgap of substantially 1.71 eV. Also preferably i-type layer 18 of a-SiGe:H is of 2,000 Å thickness and wide bandgap n-type layer 30 of a-Si:H is of 250 Å thickness.

Thus in accordance with the present invention, n-layer 30 is provided as a-Si:H having a wider bandgap than a-SiGe:H i-layer 18 and a suitable electrical conductivity (see Table I) so that the resulting photovoltaic cell has an enhanced short circuit current.

A method of forming a p-i-n photovoltaic cell, wherein the n-layer has a wide bandgap in accordance with the present invention will now be described having reference to FIG. 1.

First, conductive oxide layer 14 is disposed on one side of transparent substrate 12 by conventional deposition methods. Preferably, the conductive oxide layer comprises conductive tin oxide (CTO). Alternatively, a substrate having a pre-formed CTO layer can be used.

The CTO-coated substrate is then placed in a deposition chamber capable of depositing layers of amorphous silicon alloys on the CTO side of the substrate. DC glow discharge is the preferred method of forming the p-layer, the i-layer and the n-layer of the photovoltaic cell shown in FIG. 1. Other methods, such as RF glow discharge, photo-CVD, CVD, sputtering, evaporation, or any other appropriate thin-film deposition methods can also be used. The substrate temperature preferably is controlled at 150°–300° C. during deposition of the p-layer, the i-layer and the n-layer.

The p-layer is formed by depositing material from a gaseous mixture that contains a p-type dopant, preferably diborane ($B_2H_6$). The deposition gases preferably comprise a mixture of silane ($SiH_4$), containing 1–2% (molar) diborane, pure silane, and methane ($CH_4$). Alternatively, and as discussed in U.S. Pat. No. 4,718,947, which is specifically incorporated herein by reference, the p-layer can be formed to have alternating p-type layers of differing optical bandgaps.

After the p-type layer is formed, the deposition chamber is flushed with pure silane for 10–20 minutes and an i-layer is formed by glow discharge of a mixture silane and germane. Preferably, germane comprises 0–50%, and most preferably 0–30%, of the silane concentration. The i-layer may be either thick, on the order of 5,000–6,000 Å or thin, on the order of 2,000–3,000 Å.

After the i-layer is formed, the deposition chamber is flushed for approximately 120 seconds with the gas mixture that is to be used to form the wide bandgap n-layer 30. Preferably, the n-type dopant in the n-layer is phosphorous and the bandgap of the wide bandgap n-type layer 30 can be changed by changing the methane concentration in the gas mixture. However, as noted above, in accordance with this embodiment, layer 30 is provided as a-Si:H, i.e., free of carbon, so that the gas mixture for depositing n-layer 30 is free of methane.

After deposition of the wide bandgap n-type layer 30, a back conductive layer 25, such as, for example, a layer of metal such as aluminum is formed by conventional methods on wide bandgap n-type layer 30.

One example of a wide bandgap n-type layer 30 in accordance with the present invention is as discussed below:

EXAMPLE 1

Figure 5:
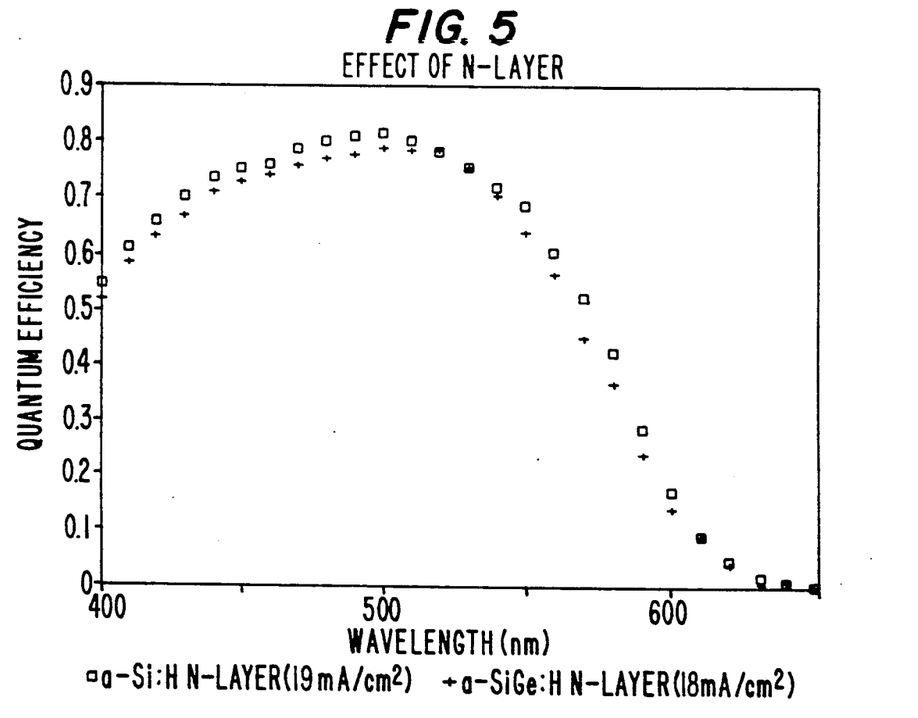
FIG. 5 is a graph showing the relationship between quantum efficiency and wavelength for a photovoltaic cell having an a-Si:H n-type layer and for a photovoltaic cell having an a-SiGe:H n-type layer.

N-type doped layers were deposited by dc glow-discharge from a mixture of silane, germane and phosphine or from a mixture of silane and phosphine. The films were characterized by optical bandgap measurements, photo-thermal deflection spectroscopy (PDS), dark conductivity and temperature dependence of dark conductivity. Single junction p-i-n solar cells were fabricated with a-SiGe:H i-layers (Eg = 1.55 eV) which had either a-SiGe:H n-layers or a-Si:H n-layers. The electrical and optical properties of a-Si:H and a-SiGe:H n-layers are tabulated in Table II and have been compared graphically as shown in FIG. 5 and discussed, above, in reference thereto.

TABLE II

| Electrical and Optical Properties of N-layers | | |
|---|---|---|
| Property | a-Si:H | a-SiGe:H |
| Optical Bandgap | 1.71 eV | 1.54 eV |
| Dark Conductivity | $6.4 \times 10^{-3}$ ohm-cm | $3.1 \times 10^{-4}$ ohm-cm |
| Activation Energy | 0.207 eV | 0.299 eV |

The photovoltaic parameters of devices having n-layers of a-SiGe:H and a-Si:H are compared in a tabular fashion in Table III.

TABLE III

| Photovoltaic Parameters of a-SiGe:H Cells with Different N-layers | | | | |
|---|---|---|---|---|
| Voc (mV) | Jsc (mA/cm$^2$) | FF | Efficiency (%) | n-layer type |
| 834 | 19.23 | 0.629 | 10.08 | a-Si:H |
| 822 | 18.03 | 0.519 | 7.69 | a-SiGe:H |

The dark conductivity of a-SiGe:H n-layer is found to be about an order of magnitude lower than that of a-Si:H n-layer. Moreover, the conductivity activation energy ($E_a$) of the a-Si-Ge:H n-layer was 0.299 eV as compared to 0.207 eV for the a-Si:H n-layer, which clearly demonstrates the inferior doping characteristics of a-SiGe:H.

II. A Sandwich N-Type Structure

Referring now to the sandwich n-type structure 20 of FIG. 2, such a structure includes, in accordance with the present invention, an n-type layer of amorphous silicon formed on the i-layer having a plurality of first and second n-type layers alternatingly formed on one another, one of the first n-type layers being formed on the i-layer. Each of the first n-type layers has a first optical bandgap and each of the second n-type layers has a second optical bandgap wider than the first optical bandgap. Preferably, the first n-type layers include an even number of layers and the second type of n-type layers include an odd number of layers. In this way, it is assured that a first n-type layer, having a narrow bandgap is contiguous with both i-layer 18 and back contact layer 25 so that good contact is established between n-type structure 20 and i-layer 18 and back contact layer 25.

As shown in FIG. 2, and as embodied herein, sandwich n-type structure 20 may include three n-layers 21, 22, and 23, n-layers 21 and 23 being of a first n-type layer and n-layer 22 being of a second n-type layer.

Figure 3:
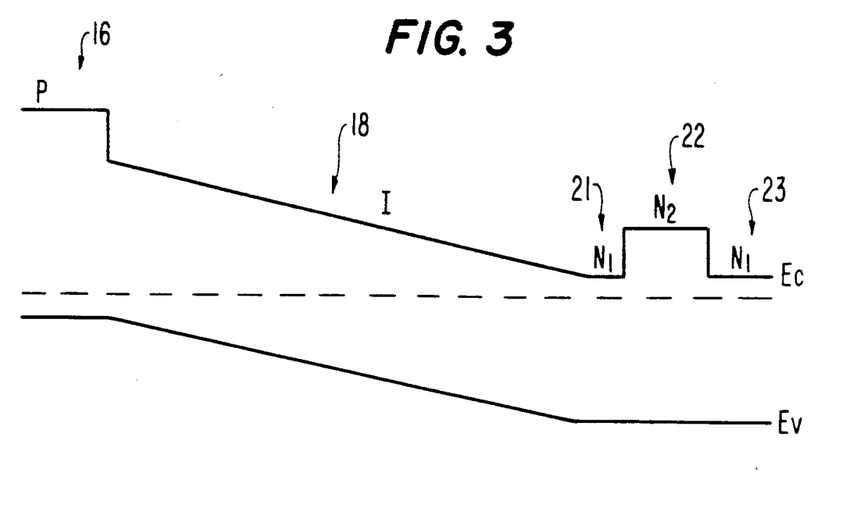
FIG. 3 is an idealized bandgap diagram for the photovoltaic cell of FIG. 2.

FIG. 3 is an idealized band diagram showing how the bandgap varies over the thickness of photovoltaic cell 10 of FIG. 2. The dashed line indicates the Fermi level. The solid line labelled Ev is the valence band, and the solid line labelled Ec is the conduction band. While the conduction band for first n-layer 21 and third n-layer 23 is shown in FIG. 3 as being equal, it should be understood that the conduction bands may be dissimilar, provided they are each less than the conduction band of second n-layer 22.

In photovoltaic cell 10, first n-layer 21 ensures a good rectifying junction between i-layer 18 and sandwich n-type structure 20. The properties of the rectifying junction depend strongly on the electrical properties of the n-layer. That is, the more conductive the n-layer is, the better the rectifying junction will be. First n-layer 21 is, therefore, preferably either a microcrystalline silicon n-layer or an a-Si:H n-layer.

By "microcrystalline" it is meant that a material whose crystalline order is in the range of substantially 25 Å to 500 Å. The presence of microcrystallinity can be determined by one or more of electron diffraction, x-ray diffraction, or Raman scattering spectroscopy.

The first n-layer 21 is, preferably, either 25-50 Å or 50-100 Å thick depending on whether the layer is microcrystalline or a-Si:H, respectively. The optical bandgap of first n-layer 21 is, preferably, in the range of 1.68 to 1.70 eV.

Second n-layer 22 is a wide bandgap n-layer. This could be any wide bandgap n-layer material but is preferably a-SiC:H. Alternatively, $N_2$ layer 22 may be a-SiN:H. The only restriction on the optical bandgap of second n-layer 22 is that the barrier created to the transport of carriers should not be higher than that which the carriers can easily overcome. If this condition does not obtain, carriers will not transit second n-layer 22 and the fill-factor of photovoltaic cell 10 will be adversely affected. An optical bandgap of second n-layer 22 in the range of 1.7-2.0 eV is preferable, with the best results being achieved with an optical bandgap of about 1.9 eV.

The third n-layer 23 is needed to ensure good ohmic contact to the back metal layer 25 and is preferably similar in composition and thickness to first n-layer 21. Specifically, third n-layer 23 is, preferably, either a microcrystalline silicon n-layer or an a-Si:H n-layer and, preferably, either 25-50 Å or 50-100 Å thick depending on whether the layer is microcrystalline or a-Si:H, respectively. The optical bandgap of third n-layer 23 is, preferably, in the range of 1.68 to 1.70 eV.

Thus, in accordance with the invention, the n-layer sandwich structure consisting of n-layers 21, 22, and 23, has a suitable electrical conductivity for forming good conductive contact with adjacent i-layer 18 and back metal layer 25, and an optical bandgap that is greater than that of i-layer 18. As a result, as illustrated by Examples 2 and 3 and Table IV below, the photovoltaic device so constructed has an advanced short circuit current and corresponding improved efficiency.

A method of forming a p-i-n photovoltaic cell, wherein the n-layer has the sandwich structure of the present invention will now be described having reference to FIG. 2.

First, conductive oxide layer 14 is disposed on one side of transparent substrate 12 by conventional deposition methods. Preferably, the conductive oxide layer comprises conductive tin oxide (CTO). Alternatively, a substrate having a pre-formed CTO layer can be used.

The CTO-coated substrate is then placed in a deposition chamber capable of depositing layers of amorphous silicon alloys on the CTO side of the substrate. DC glow discharge is the preferred method of forming the p-layer, the i-layer, and sandwich type n-layer of the photovoltaic cell shown in FIG. 2. Other methods, such as RF glow discharge, photo-CVD, CVD, sputtering, evaporation, or any other appropriate thin-film deposition methods can also be used. The substrate temperature preferably is controlled at 150°–300° C. during deposition of the p-layer, the i-layer, and the n-layer.

The p-layer is formed by depositing material from a gaseous mixture that contains a p-type dopant, preferably diborane ($B_2H_6$). The deposition gases preferably comprise a mixture of silane ($SiH_4$), containing 1–2% (molar) diborane, pure silane, and methane ($CH_4$). Alternatively, and as discussed in U.S. Pat. No. 4,718,947, which is specifically incorporated herein by reference, the p-layer can be formed to have alternating p-type layers of differing optical bandgaps.

After the p-type layer is formed, the deposition chamber is flushed with pure silane for 10–20 minutes and an i-layer is formed by glow discharge of pure silane. The i-layer may be either thick, on the order of 5,000–6,000 Å or thin, on the order of 2,000–3,000 Å.

After the i-layer is formed, the deposition chamber is flushed for approximately 120 seconds with the gas mixture that is to be used to form the first n-layer 21. Preferably, the n-type dopant in the n-layer is phosphorous and the bandgaps of the first and second n-layers, 21 and 22, respectively, are changed by changing the methane concentration in the gas mixture, there being no methane in the gas mixture for depositing first n-layer 21.

A mixture of silane containing phosphine ($PH_3$) and pure silane is used to deposit first n-layer 21. A methane concentration is then added to the gas mixture to achieve the desired bandgap for the second n-layer 22 and the second n-layer 22 is deposited. The methane concentration is removed from the gas mixture to achieve the desired bandgap for the third n-layer 23. The third n-layer 23 is then deposited.

After deposition of the sandwich n-type structure 20, a metal back contact 25, such as, for example, an aluminum layer, is formed by conventional methods on sandwich n-type structure 20.

Following are two examples of photovoltaic cells having sandwich n-type structures 20 in accordance with the present invention.

EXAMPLE 2

Two photovoltaic cells, each having an i-layer of 2,500 Å thickness, were prepared in a conventional manner. Both cells had an aluminum back contact 25. One cell, the control cell, had a 1,000 Å a-Si:H n-layer while the other had sandwich n-type structure 20 including a 100 Å thick a-Si:H first n-layer 21, 800 Å thick a-SiC:H second n-layer 22, and a 100Å thick a-Si:H third n-layer 23.

Figure 4:
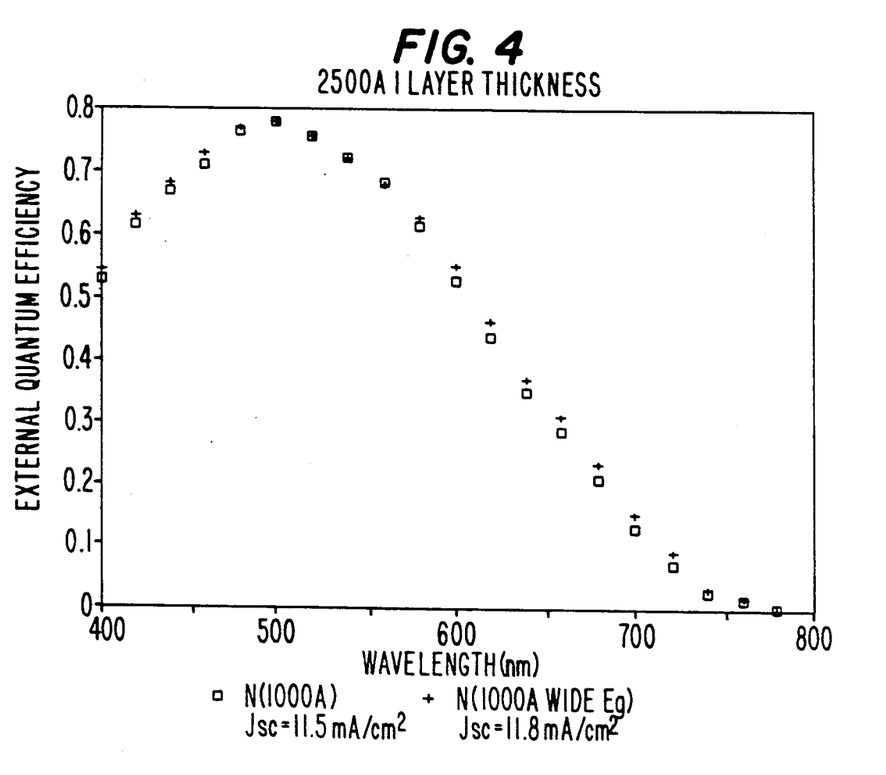
FIG. 4 is a graph showing the relationship between quantum efficiency and wavelength for a photovoltaic cell having a sandwich n-type structure and for a photovoltaic cell having a conventional n-layer.

FIG. 4 is a graph of quantum efficiency versus wavelength for the two photovoltaic cells. As can be seen from FIG. 4, the short-circuit current density increases by 0.3 mA/cm$^2$ for the photovoltaic cell having sandwich n-type structure 20 over the photovoltaic cell having a conventional n-layer structure. This improvement comes mainly from an increased response from the long wavelength region which is due to decreased absorption of long wavelength light in the sandwich n-type structure 20.

EXAMPLE 3

Applicants calculated the difference in short-circuit current density between a photovoltaic cell having a 500 Å thick n-layer of a conventional structure and a photovoltaic cell having a sandwich n-type structure 20 of the present invention.

For a photovoltaic cell including a sandwich n-type structure 20 having a first and third n-layer 21 and 23, respectively, of 100 Å thickness each and optical bandgaps of 1.7 e.v., and a second n-layer 22 of 300 Å thickness and an optical bandgap of 2.0 eV, an increase of 0.4 mA/cm$^2$ in the short-circuit current density will be realized over a conventional a-Si:H photovoltaic cell. In this example, a thick i-layer was assumed. As used herein, the term "thick i-layer" refers to an i-layer having a thickness in the range of 5,000 to 6,000 Å and, preferably, about 5,800 Å thick.

For an a-Si:H photovoltaic cell having a thin i-layer, a sandwich n-type structure 20 as described above will result in an increase of 0.86 mA/cm$^2$ in the short circuit current density over a conventional photovoltaic cell. As used herein, the term "thin i-layer" refers to an i-layer having a thickness in the range of 2,000 to 3,000 Å and, preferably, about 2,500 Å thick.

Table IV shows the current losses in the respective n-layers of single p-i-n junction photovoltaic cells for a conventional and sandwich n-type layer, each being part of an a-Si:H photovoltaic cell having a thin i-layer.

TABLE IV

| Amorphous Silicon Single Junction Cell, i-layer = 2500Å | |
| --- | --- |
| (a) Current lost in 500Å a-Si:H n-layer | 1.948 mA/cm$^2$ |
| (b) Current lost in 100Å a-Si:H $N_1$-layer | 0.440 mA/cm$^2$ |
| Current lost in 300Å a-SiC:H $N_2$-layer | 0.131 mA/cm$^2$ |
| Current lost in 100Å a-Si:H $N_1$-layer | 0.514 mA/cm$^2$ |
| Total current loss in sandwich structure | 1.086 mA/cm$^2$ |
| Net gain in current = (b) − (a) = ' | 0.861 mA/cm$^2$ |

For an amorphous silicon photovoltaic cell module having, for example, a total module area 1,000 cm$^2$, with a segment area of 30 cm$^2$, this increase in the short-circuit current density amounts to a significant improvement of about 25 mA short-circuit current.

The calculations presume that the reflection from the rear contact reflector is extremely good (for example, ITO/Ag has 95% reflectance as compared to Al which has about 83% reflectance).

It has been calculated that when the thickness of first and third n-layers, 21 and 23 are on the order of 100 Å, the thickness of second n-layer 22 may be on the order of 200–400 Å to provide good results.

III. A Superlattice N-layer

Also in accordance with the present invention, a superlattice n-layer of amorphous silicon may be formed on the i-layer. The superlattice n-layer includes a plurality of first and second layers alternatingly formed on one another, each of the first layers having a first optical bandgap and each of the second layers having a second optical bandgap wider than the first optical bandgap.

As embodied herein, and shown in FIG. 6, a superlattice n-layer 24 is provided that includes a plurality of first and second layers designated $N_1$ and $N_2$, respectively. First and second layers, $N_1$ and $N_2$, respectively, are alternatingly formed on one another as shown in FIG. 6, to establish an alternating superlattice structure having alternating layers $N_1N_2N_1N_2$... Preferably, the number of first layers $N_1$ is in the range of 8–10 and the number of second layers $N_2$ is in the range of 8–10.

First layers $N_1$ are, preferably, a-Si:H n-layers and, preferably, have optical bandgaps in the range of 1.681–1.70 eV and thicknesses on the order of 12–50 Å. Preferably an $N_1$ layer is contiguous with the i-layer 18 and another $N_1$ layer is contiguous with back contact 25 to provide good electrical contact between superlattice n-layer 24 and i-layer 18 and back contact 25.

Second layers $N_2$ can have much wider optical bandgaps than the first layers $N_1$, provided the thicknesses of second layers $N_2$ are small. To provide the wider optical bandgap, second layer $N_2$ is, preferably, an a-SiC:H n-layer. Preferably, second layers $N_2$ have an optical bandgap in the range of 1.7–2.1 eV, with best results achievable when the optical bandgap is 2.0 eV. The thicknesses of second layers $N_2$ are preferably in the range of 12–50 Å.

The thicknesses of second layers $N_2$ are critical because, in the superlattice structure, the carriers tunnel through the second layers $N_2$ rather than overcome the barrier. Hence, the thickness of the wide bandgap second layers $N_2$ is more important than the optical bandgap. The thickness must be sufficiently small so that carriers can tunnel through.

The resulting superlattice n-layer 24 has a "composite" optical bandgap in the range of 2.0–2.1 eV when the range of optical bandgaps of first layers $N_1$ and second layers $N_2$ are as described above. That is, the optical bandgap of the superlattice n-layer 24, taken as a whole, is in the range of 2.0 to 2.1 eV. Further, superlattice n-layer 24 has a dark resistivity in the range of $5-6 \times 10^4$ ohm-cm with activation energies of 0.38 eV–0.40 eV. It is to be noted that the "composite" optical bandgap of superlattice layer 24 may be as much as 2.1 eV, which is greater than the individual optical bandgaps of either the first and second layers, $N_1$ and $N_2$, respectively.

Front conductive layer 14, p-layer 16, and i-layer 18 of photovoltaic cell 10 of FIG. 6 are disposed on substrate 12 in the same manner as described in reference to the corresponding layers of photovoltaic cell 10 of FIG.

2, with the exception that superlattice n-layer 24 is formed by alternatingly depositing material from two distinct gaseous mixtures corresponding to the first layers $N_1$ and second layers $N_2$. The length of deposition for the first layer $N_1$ in the superlattice n-layer 24 is shorter than the deposition time of the n-layers for the sandwich n-type structure 20 of FIG. 2 to produce correspondingly thinner layers. As discussed in reference to the formation of sandwich n-type structure 20, the bandgaps of first, second, and third n-layers, 21, 22, and 23, respectively, can be adjusted by adding or removing a methane concentration of the gas mixture from which they are deposited. Similarly, the optical bandgaps of first layers $N_1$ and second layers $N_2$, of superlattice n-layer 24 can be adjusted by such adjustment of the methane concentration of the gas mixture from which they are deposited.

Figure 7:
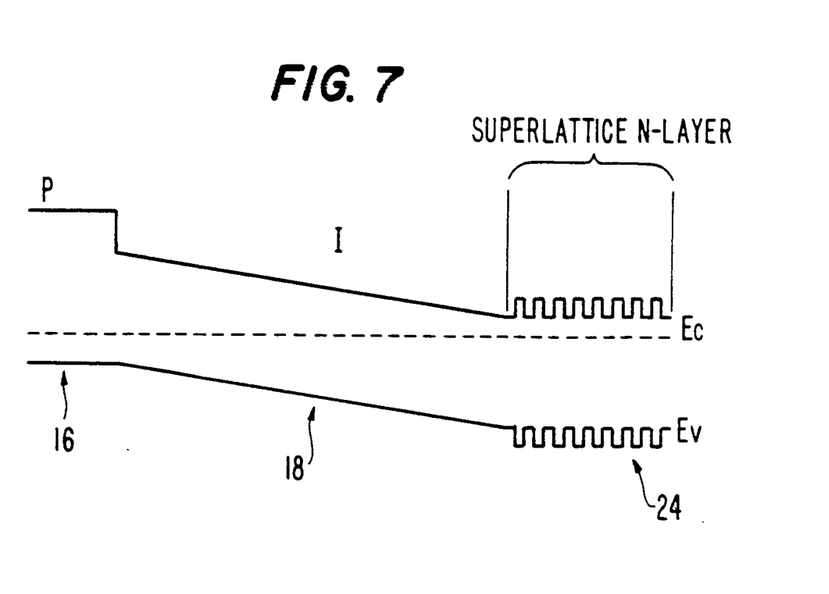
FIG. 7 is an idealized bandgap diagram for the photovoltaic cell of FIG. 6.

FIG. 7 is an idealized band diagram showing how the bandgap varies over the thickness of photovoltaic cell 27 of FIG. 6. The dashed line indicates the Fermi level. The solid line labelled Ev is the valence band, and the solid line labelled Ec is the conduction band. The optical bandgap, Eg, is the distance between Ev and Eg. FIG. 7 shows an idealized band diagram for a photovoltaic cell of the present invention wherein superlattice n-layer 24 includes nine first layers $N_1$ and eight second layers $N_2$.

Figure 8:
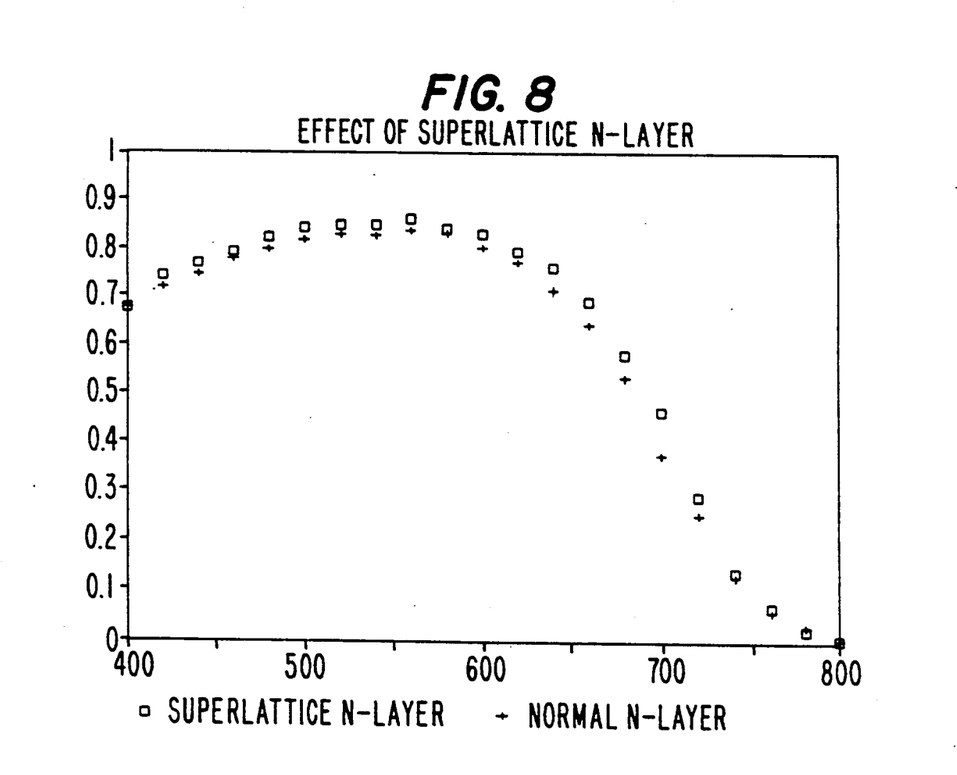
FIG. 8 is a graph showing the relationship between quantum efficiency and wavelength for a photovoltaic cell having a superlattice n-layer and for a photovoltaic cell having a conventional n-layer.

FIG. 8 shows the quantum efficiency versus wavelength measurements of two cells, one with an a-Si:H n-layer and the other with a superlattice n-layer. The superlattice n-layer photovoltaic cell has a superior response which is attributable to the improved long wavelength response of the photovoltaic cell that includes a superlattice n-layer 24 photovoltaic cell of the present invention.

It will be apparent to those skilled in the art that modifications and variations can be made in the photovoltaic cells of this invention without departing from the scope of the invention in its broader aspects. The present invention is, therefore, not limited to the specific details shown and described. For example, the first and third n-layers 21 and 23, respectively, of the sandwich n-type structure 20 of FIG. 2 have been described as having the same optical bandgap and conductivity. This is not essential to the practice of the present intention. All that is required is that the first n-layer 21 be sufficiently conductive so that a good rectifying junction is formed between first n-layer 21 and i-layer 18 and that third n-layer 23 must be sufficiently conductive to ensure good ohmic contact between third n-layer 23 and back metal layer 22. Accordingly, it is intended that the present invention cover such modifications and variations, provided they fall within the scope of the appended claims and their equivalents.

What is claimed is:

1. A photovoltaic cell, comprising:
   a transparent substrate;
   a transparent front conductive layer formed on said substrate;
   a p-type layer formed on said front conductive layer;
   an i-layer of amorphous silicon formed on said p-layer;
   an n-type sandwich structure of amorphous silicon formed on said i-layer, said n-type sandwich structure including first, second, and third n-layers successively formed on one another, said first n-layer being formed on said i-layer to form a rectifying junction therewith, said second n-layer being formed on said first n-layer, and said third n-layer being formed on said second n-layer, said second n-layer having an optical bandgap wider than respective optical bandgaps of said first and third n-type layers and said i-layer;
   said second n-layer having a thickness at least two times the thickness of each of said first and third n-layers; and
   a back contact layer of conductive material formed on said third n-layer to form an ohmic contact therewith.

2. A photovoltaic cell as recited in claim 1 wherein said first and third n-layers have substantially the same optical bandgap.

3. A photovoltaic cell as recited in claim 1, wherein the optical bandgap of said first and third n-layers is in the range of 1.68 to 1.70 eV.

4. A photovoltaic cell as recited in claim 1, wherein the optical bandgap of said second n-layer is in the range of 1.7 to 2.0 eV.

5. A photovoltaic cell as recited in claim 4, wherein the optical bandgap of said second layer is 1.9 eV.

6. A photovoltaic cell as recited in claim 1, wherein said first and third n-layers are each on the order of 50 to 100 Å thick.

7. A photovoltaic cell as recited in claim 6, wherein said first and third n-layers are each about 100 Å thick.

8. A photovoltaic cell as recited in claim 7, wherein said second n-layer is about 800 Å thick.

9. A photovoltaic cell as recited in claim 7, wherein said second n-layer is on the order of 200 to 400 Å thick.

10. A photovoltaic cell as recited in claim 1, wherein said first and third n-layers have a thickness on the other of 25 to 50 Å and are comprised of microcrystalline silicon.

11. A photovoltaic cell as recited in claim 1, wherein said first and third n-layers have a thickness on the order of 50 to 100 Å and are comprised of amorphous silicon.

12. A method for making a photovoltaic cell on a transparent substrate, comprising:
   (a) forming a transparent front conductive layer on the transparent substrate;
   (b) forming a p-type layer on said front conductive layer;
   (c) forming an i-layer of amorphous silicon having a first optical bandgap on said p-layer;
   (d) forming an n-type sandwich structure of amorphous silicon no said i-layer by:
      (i) forming a first n-layer on said i-layer to form a rectifying junction therewith, said first n-layer having a second optical bandgap;
      (ii) forming a second n-layer on said first n-layer, said second n-layer having a third optical bandgap wider than said first and second optical bandgaps, said second n-layer having a thickness at least two times the thickness of said first n-layer; and
      (iii) forming a third n-layer on said second n-layer, said third n-layer having a fourth optical bandgap less than said third optical bandgap and a thickness no more than half the thickness of said second n-layer; and
   (e) forming a back contact layer of conductive material on said third n-layer to form an ohmic contact therewith.

13. A photovoltaic cell, comprising:
   a transparent substrate;

a transparent front conductive layer formed on said substrate;

a p-type layer formed on said front conductive layer;

an i-layer of amorphous silicon formed on said p-layer;

an n-type sandwich structure formed on said i-layer, said n-type sandwich structure including first, second, and third n-layers successively formed on one another, said first n-layer being formed on said i-layer to form a rectifying junction therewith, said second n-layer being formed on said first n-layer, and said third n-layer being formed on said second n-layer, said second n-layer having an optical bandgap wider than respective optical bandgaps of said first and third n-type layers and said i-layer;

said first and third n-layers each comprised of doped a-Si:H and having a thickness on the order of 50 to 100 Å;

said second n-layer comprised of doped a-SiC:H and having a thickness on the order of 200 to 400 Å; and a back contact layer of conductive material formed on said third n-layer to form an ohmic contact therewith.

* * * * *

UNITED STATES PATENT AND TRADEMARK OFFICE
CERTIFICATE OF CORRECTION

PATENT NO. : 5,055,141

DATED : October 8, 1991

INVENTOR(S) : Rajeewa R. Arya, et al

It is certified that error appears in the above-identified patent and that said Letters Patent is hereby corrected as shown below:

Col. 5, lines 34,35 "Also preferably i-type" should read --Also, preferably, i-type--.

Col. 10, line 32 "1.681 - 1.70 eV" should read --1.68 - 1.70 eV--.

Col. 12, line 49 "no" should read --on--.

Signed and Sealed this

Eighteenth Day of May, 1993

Attest:

MICHAEL K. KIRK

Attesting Officer

Acting Commissioner of Patents and Trademarks